(12) United States Patent
Tsai et al.

(10) Patent No.: US 7,688,934 B2
(45) Date of Patent: Mar. 30, 2010

(54) SHIFT REGISTER AND SHIFT REGISTER UNIT FOR DIMINISHING CLOCK COUPLING EFFECT

(75) Inventors: Tsung-ting Tsai, Hsin-Chu (TW); Ming-sheng Lai, Hsin-Chu (TW); Yung-chih Chen, Hsin-Chu (TW); Po-yuan Liu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/409,280

(22) Filed: Mar. 23, 2009

(65) Prior Publication Data

US 2009/0304138 A1 Dec. 10, 2009

(30) Foreign Application Priority Data

Jun. 6, 2008 (TW) .............................. 97121312 A

(51) Int. Cl.
G11C 19/00 (2006.01)
(52) U.S. Cl. .......................................... 377/64; 377/79
(58) Field of Classification Search ........................ None
See application file for complete search history.

(56) References Cited

U.S. PATENT DOCUMENTS

| 6,845,140 | B2 | 1/2005 | Moon et al. |
| 7,283,603 | B1 * | 10/2007 | Chien et al. ..................... 377/64 |
| 7,310,402 | B2 | 12/2007 | Wei et al. |
| 7,405,716 | B2 * | 7/2008 | Lee et al. ....................... 345/87 |
| 7,590,214 | B2 * | 9/2009 | Liu et al. ....................... 377/64 |
| 2003/0189542 | A1 | 10/2003 | Back-Won et al. |
| 2006/0017685 | A1 | 1/2006 | Tseng et al. |
| 2006/0284815 | A1 | 12/2006 | Kwon et al. |
| 2008/0056431 | A1 * | 3/2008 | Chien et al. .................... 377/79 |

FOREIGN PATENT DOCUMENTS

TW I246086 12/2005

* cited by examiner

*Primary Examiner*—Cassandra Cox
(74) *Attorney, Agent, or Firm*—Kirton & McConkie; Evan R. Witt

(57) ABSTRACT

A shift register and a shift register unit for diminishing clock coupling effect are introduced herein. Each stage shift register unit includes at least one pull-up driving module, a pull-up module, at least one pull-down module and a pull-down driving module. Before a waveform of either a first clock signal or a second clock signal employed by the pull-up module transits into a rising edge, the pull-down driving module employs a first periodic signal to turn on the pull-down module in advance for a specific period, and/or before the waveform of the first or second clock signal employed by the pull-up module transits into a falling edge, the pull-down driving module employs a second periodic signal to turn off the pull-down module in advance for a specific period. Accordingly, the pull-down module can gain a sufficient capability against the clock coupling effect so as to optimize the waveform outputted from the shift register unit.

30 Claims, 11 Drawing Sheets

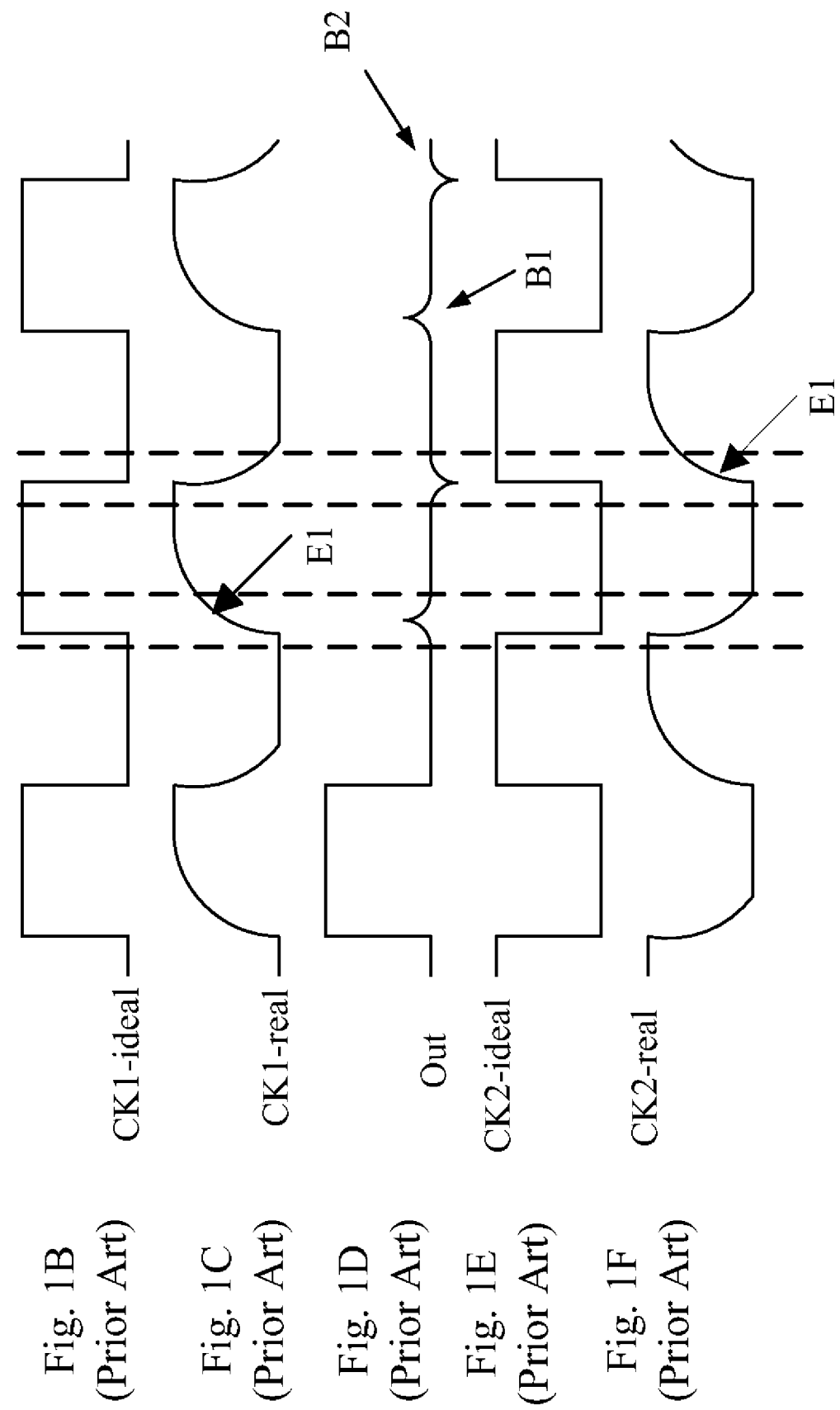
Fig. 1B (Prior Art) CK1-ideal
Fig. 1C (Prior Art) CK1-real
Fig. 1D (Prior Art) Out
Fig. 1E (Prior Art) CK2-ideal
Fig. 1F (Prior Art) CK2-real

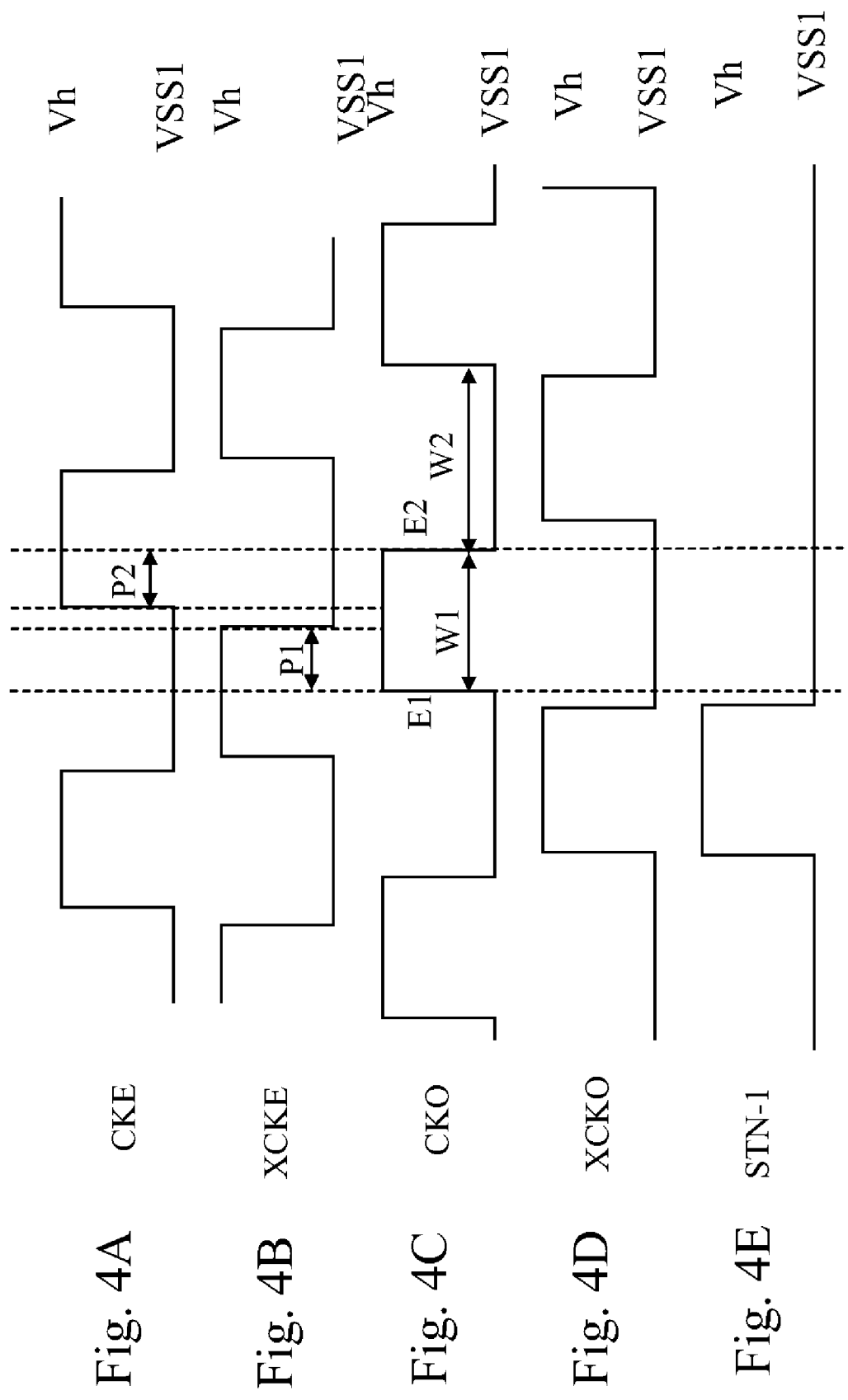

US 7,688,934 B2

SHIFT REGISTER AND SHIFT REGISTER UNIT FOR DIMINISHING CLOCK COUPLING EFFECT

BACKGROUND OF THE INVENTION

1. Field of the Invention

The present invention relates to a shift register and a shift register unit, and more particularly to a shift register and a shift register unit used for diminishing clock coupling effect.

2. Description of the Prior Art

Conventional liquid crystal display (LCD) utilizes a set of driving circuits for controlling gray signal outputs of a plurality of pixel units located in a LCD panel. The driving circuits further include a gate driver electrically connected with transverse scan lines (or gate lines) in turn each for outputting a gate pulse signal to each corresponding pixel unit, and a source driver electrically connected with longitudinal data lines (or source lines) each for transmitting a data signal to each corresponding pixel unit 20 separately. Each of the intersections between the transverse scan lines and longitudinal data lines is electrically connected with two terminals of an active component (such as a transistor having a gate and a source) corresponding to the pixel unit. At the same time when the gate driver outputs gate pulse signals in turn via the scan lines to turn on the transistor of each pixel unit, the source driver outputs corresponding data signals via the data lines to charge a capacitor of each pixel unit to reach a required voltage level so as to display various gray levels.

To lower chip expense of the gate driver, the conventional Thin-Film Transistor LCD (TFT-LCD) panel based on such as a Low Temperature Poly-Silicon (LTPS) process technique adopts an integrated gate driver module design, by way of relocating a shift register from the existing gate driver chip to the glass substrate, to constitute cascaded multi-stage shift register modules as implementing "Gate on Array (GOA)". This functions as same as the shift register did in the original gate driver. Because the LTPS-based panel mostly adopts Poly-Silicon transistors, the Poly-Silicon transistors have a mobility of over two-hundred multiple than that of amorphous-Si transistors. However, for the same reason as reducing the panel cost, the a-Si process with a very low mobility also realize such a circuit design on its glass substrate, gradually.

Presently, a shift register design adopted by the most conventional integrated gate driver modules is disposed with a pull-down module or the likes to prevent the gate pulse signal output of the shift register from distortions invoked by pull up of other signals. Such a pull-down module is mostly driven by a clock signal (CK) or an inverted clock signal (XCK). Please refer to FIG. 1A, which is illustrated with a schematic circuitry diagram of the Nth stage shift register 210 as disclosed in U.S. Pat. No. 7,310,402 B2. In the Nth stage shift register 210, all of a pull-up transistor Q2 and two pull-down modules 1 and 2 employ a first clock signal (CK1). Although a prefect waveform of an ideal first clock signal (CK1-ideal) is introduced in FIG. 1B, the first clock signal (CK1) is inevitably involved with a coupling effect of a capacitor inhering between both of the drain and gate of the pull-up transistor Q2 under an actual operation and therefore transforms into a waveform of a real first clock signal (CK1-real), as depicted in FIG. 1C., with a curved edge "E1" representing a slower rising velocity. This would cause periodic occurrences of a plurality of upward spikes "B1" on waveform output (Out) of the gate pulse signal as depicted in FIG. 1D. Simultaneously, with involvement of driving the pull-down modules 1 and 2 in delays by the first clock signal (CK1), a signal level of either an output node (P8) or an input node (P2) of a pull-up module containing the pull-up transistor of Q2 also would not be timely pulled down and therefore provides a poor pull-down performance. Besides, an ideal second clock signal (CK2-ideal) as depicted in FIG. 1E employed by the pull down module 2 also is transformed into a real second clock signal (CK2-real) as depicted in FIG. 1F, based on the same coupling effect as occurring in the first clock signal (CK1), with the curved edge "E1" representing a slower rising velocity. This causes periodic occurrences of a plurality of downward spikes "B2" on the waveform output (Out) of the gate pulse signal as depicted in FIG. 1D.

Hence, it is a significant topic of how to deal with such a problem.

BRIEF SUMMARY OF THE INVENTION

To resolve the abovementioned drawbacks, a primary object of the present invention is to provide a shift register and a shift register unit used for diminishing clock coupling effect, which employ other periodic signals for driving a pull-down module and thereby provide the pull-down module with a capability of sufficiently resisting the clock coupling effect occurring in clock signal, so as to optimize waveform output of the shift register.

To accomplish the above invention object, a shift register according to the present invention comprises a plurality of odd-stage shift register units and a plurality of even-stage shift register units. Each of the shift register units has at least one pull-up driving module, a pull-up module, at least one pull-down module and a pull-down driving module.

The pull-up driving module provides a driving signal according to a pulse signal. The pull-up module outputs an output signal according to one of a first signal and a second signal as long as triggered by the driving signal to be electrically conductive. The pull-down module provides the pull-up module with a first source voltage. The pull-down driving module is based on a third signal to turn on the pull-down module in advance for a specific period before a waveform of either the first signal or the second signal transits into a rising edge, and/or the pull-down driving module is based on a fourth signal to turn off the pull-down module in advance for a specific period before the waveform of either the first signal or second signal transits into a falling edge.

In an embodiment according to the present invention, for the odd-stage shift register units the first signal is designated into a first clock signal, the second signal is designated into a second clock signal which is inverted with relative to the first clock signal, the third signal is designated into a first periodic signal and the fourth signal is designated into a second periodic signal which is inverted with relative to the first periodic signal. The odd-stage shift register units, at least one of which utilizes the pull-up driving module to turn on the pull-up module based on a setting signal generated from the previous odd-stage shift register unit or an initial setting signal so that the turned-on pull-up module of the odd-stage shift register unit generates a pulse signal for the pull-up driving module of the next odd-stage shift register unit. Furthermore, the pull-up driving module of the odd-stage shift register unit connects the first source voltage to turn off the pull-up module of the odd-stage shift register unit, based on a setting signal generated from the next odd-stage shift register unit.

For the even-stage shift register units, the first signal is designated into the first periodic signal, the second signal is designated into the second periodic signal, the third signal is designated into the first clock signal and the fourth signal is designated into the second clock signal. At least one of the even-stage shift register units utilizes the pull-up driving module to provide the driving signal to turn on the pull-up module based on a setting signal generated from the previous even-stage shift register unit or an initial setting signal so that the turned-on pull-up module of the even-stage shift register unit generates a pulse signal for the pull-up driving module of the next even-stage shift register unit, and utilizes the pull-up driving module of the even-stage shift register unit to connect the first source voltage to turn off the pull-up module of the even-stage shift register unit, based on a setting signal generated from the next even-stage shift register unit.

In the embodiment, a waveform of the first periodic signal is maintained ahead of a waveform of the first clock signal in a phase shift less than 180 degree, and a waveform of the second periodic signal is maintained to lag behind a waveform of the first clock signal in a phase shift less than 180 degree. In another embodiment, a crest width of the waveform of the first periodic signal is smaller than a trough width of the waveform of the second periodic signal, and a crest width of the waveform of the first clock signal is smaller than a trough width of the waveform of the second clock signal, or each of the waveforms of the first periodic signal, second periodic signal, the first clock signal and the second clock signal has a trough width and a crest width smaller than the trough width.

In another embodiment, each of the pull-down driving modules of the shift register unit can be changed to connect with a second source voltage having a level lower than that of the first source voltage, and thereby timely turn off the corresponding pull-down modules.

In another embodiment, before the first clock signal transits from a low level to a high level, a capacitor is used to pre-maintain the second periodic signal at the high level which can turn on the pull-down module, and thereby can resist the coupling effect.

The advantages and novel features of the invention will become more apparent from the following detailed description of a preferred embodiment when taken in conjunction with the accompanying drawings.

BRIEF DESCRIPTION OF THE DRAWINGS

The present invention may best be understood through the following description with reference to the accompanying drawings, in which:

FIG. 1B to FIG. 1F illustrate various signal waveforms of the conventional shift register as shown in FIG. 1A, which respectively depict an ideal first clock signal, a real first clock signal, a output signal, an ideal second clock signal and an real second clock signal;

FIG. 4A to FIG. 4E illustrate various signal waveforms of the shift register unit according to the first preferred embodiment of the present invention, which respectively depict a first periodic signal, a second periodic signal, a first clock signal, a second clock signal and a setting signal generated from the previous stage shift register unit;

DETAILED DESCRIPTION OF THE INVENTION

Figure 1A:
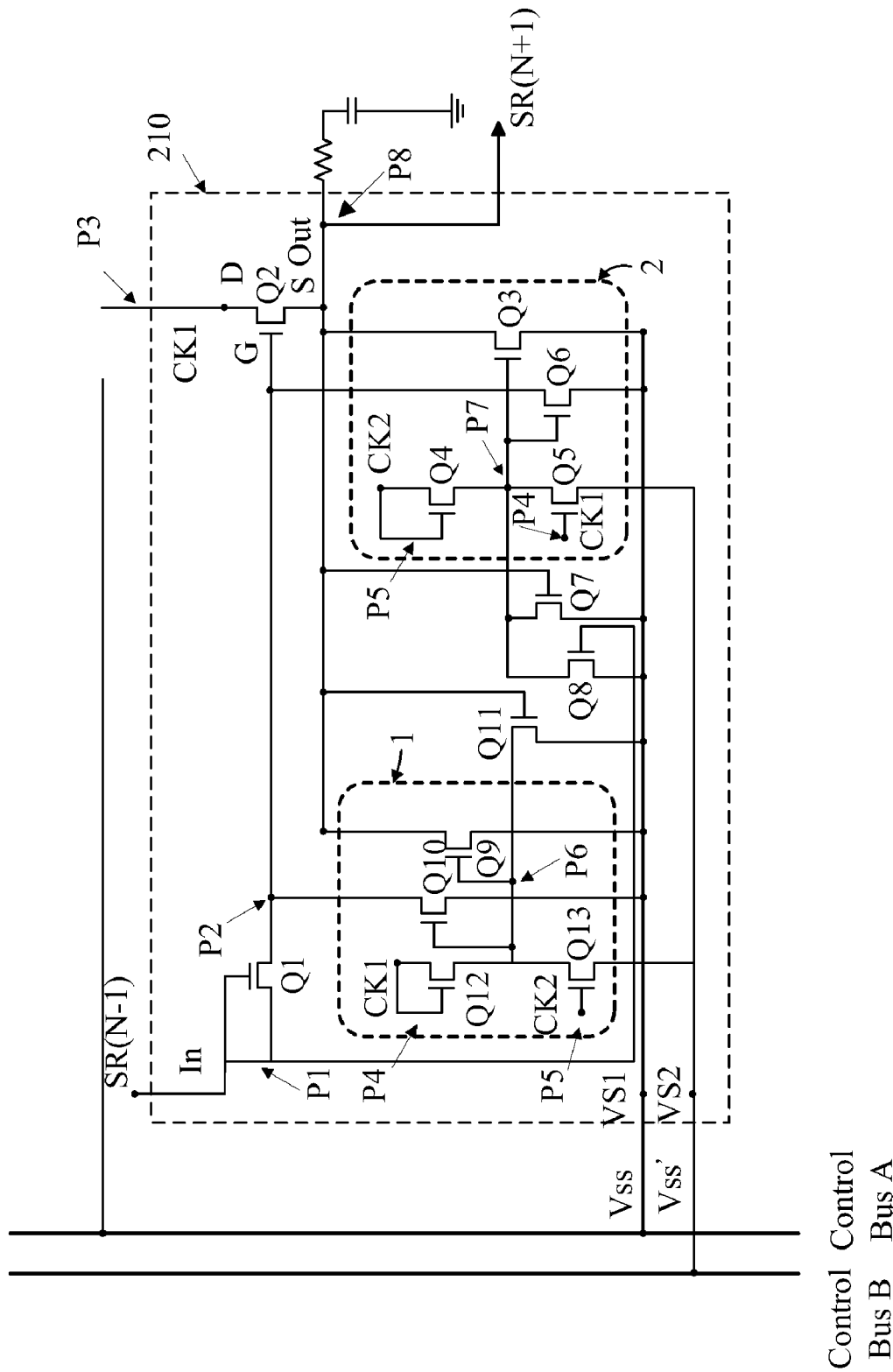
FIG. 1A illustrates a schematic circuitry diagram of a conventional shift register.
Figure 2:
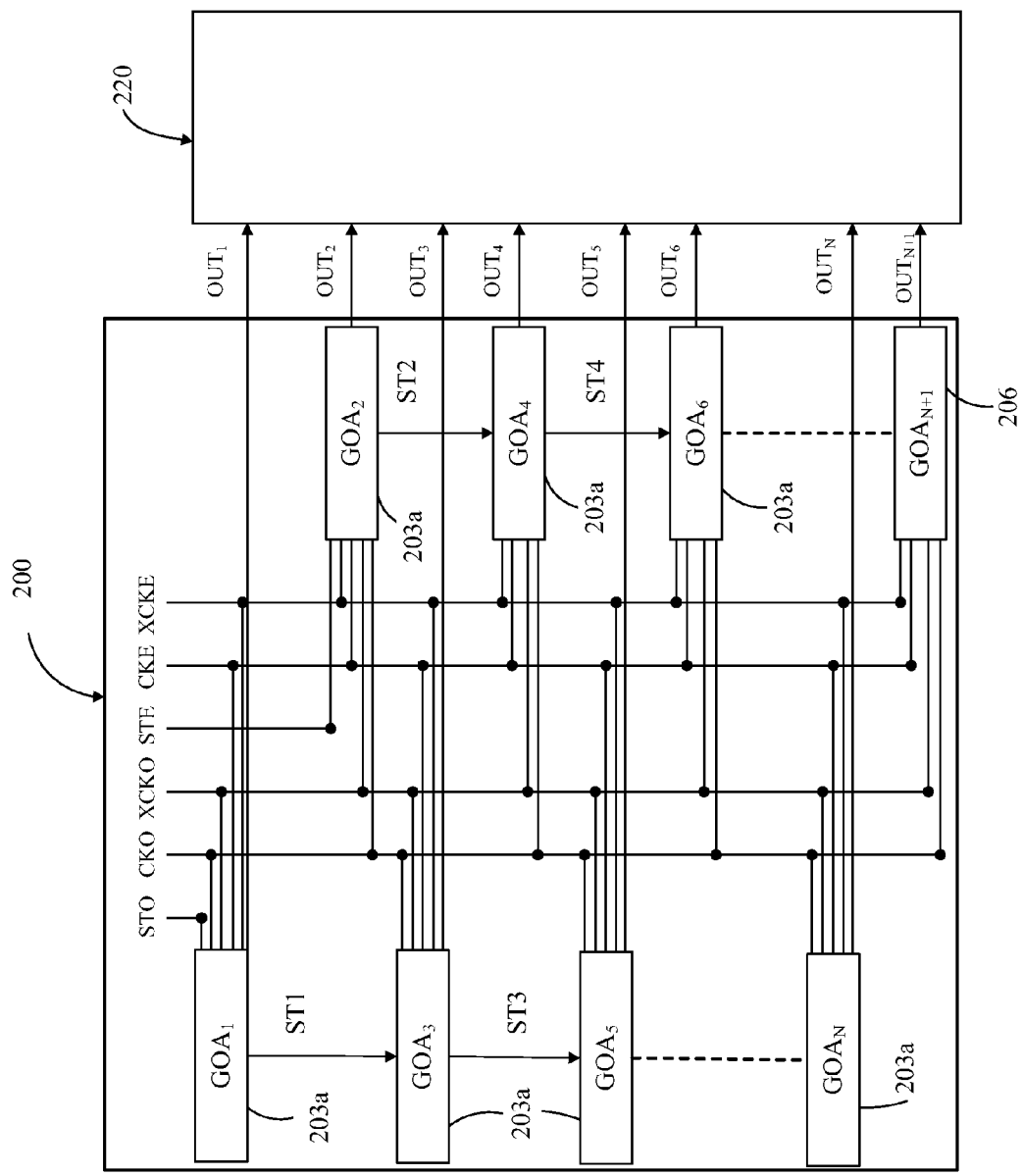
FIG. 2 illustrates an architecture diagram of a shift register according to a first preferred embodiment of the present invention.

Firstly referring to illustration of FIG. 2, a shift register 200 according to a first prefer embodiment of the present invention is introduced herein, which includes a plurality of odd-stage cascaded shift register units 203a (e.g. $GOA_1$, $GOA_3$, $GOA_5$ ... $GOA_N$) and a plurality of even-stage cascaded shift register units 203a (e.g. $GOA_2$, $GOA_4$, $GOA_6$ ... $GOA_{N+1}$). Those even-stage and odd-even shift register units 203a are used to output their gate pulse signals ($OUT_1$, $OUT_2$, ... $OUT_{N+1}$) in turns via a plurality of corresponding gate lines or scan lines to trigger gates of thin film transistors (TFTs) intersected between the gate lines and data lines disposed on matrix pixels 220 of a liquid crystal display (LCD) panel and thereby store several gray data transmitted from the data lines of the LCD panel.

In the odd-stage cascaded shift register units 203a (e.g. $GOA_1$, $GOA_3$, $GOA_5$ ... $GOA_N$), except that the first stage shift register unit 203a (e.g. $GOA_1$) generates its first gate pulse signal ($OUT_1$) based on an initial setting signal (STO), each of the other odd-stage shift register units 203a (e.g. $GOA_3$, $GOA_5$ ... $GOA_N$) generates the gate pulse signal based on a setting signal generated from a previous odd-stage shift register unit. For example, as shown in FIG. 2, the third shift register unit 203a (e.g. $GOA_3$) is based on a first setting signal (ST1) generated from the first shift register unit 203a (e.g. $GOA_1$) to output its third gate pulse signal ($OUT_3$). Likewise, in the even-stage cascaded shift register units 203a (e.g. $GOA_2$, $GOA_4$, $GOA_6$ ... $GOA_{N+1}$), except that the second stage shift register unit 203a (e.g. $GOA_2$) generates its second gate pulse signal ($OUT_2$) based on another initial setting signal (STE), each of the other even-stage shift register units 203a (e.g. $GOA_4$, $GOA_6$ ... $GOA_{N+1}$) generates the gate pulse signal based on a setting signal generated from a previous even-stage shift register unit. For example, as shown in FIG. 2, the fourth shift register unit 203a (e.g. $GOA_4$) is based on a second setting signal (ST2) generated from the second shift register unit 203a (e.g. $GOA_2$) to output its fourth gate pulse signal ($OUT_4$).

Each of the shift register units 203a (e.g. GOA₁, GOA₂, GOA₃ ... GOA$_{N+1}$) is electrically connected with all of a first clock signal (CKO), a second clock signal (XCKO), a first periodic signal (CKE) and a second periodic signal (XCKE) but different connecting locations thereamong in compliance with difference between the odd and even stages (detailed later), wherein the first clock signal (CKO) reveals an inverted phase relative to the second clock signal (XCKO), and the first periodic signal (CKE) reveals an inverted phase relative to the second periodic signal (XCKE).

Figure 3A:
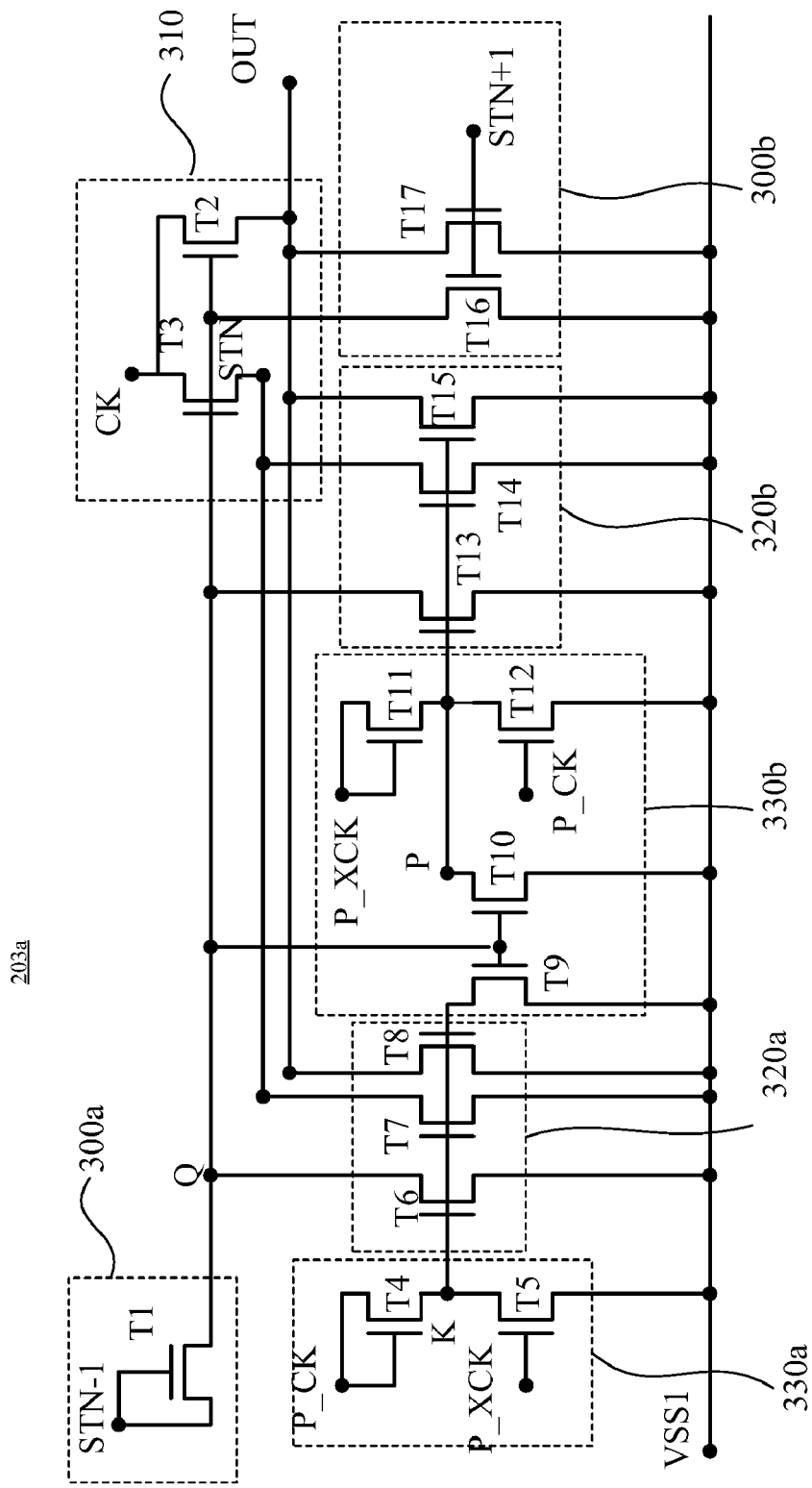
FIG. 3A illustrates a schematic circuitry diagram of each of shift register units in the shift register of the according to the first preferred embodiment of the present invention.

Please further refer to FIGS. 2 and 3A which illustrates a schematic circuitry diagram of each of the shift register units 203a of the shift register 200. Each of the shift register units 203a primarily comprises a first pull-up driving module 300a, a second pull-up driving module 300b, a pull-up module 310, a first pull-down module 320a, a second pull-down module 320b, a first pull-down driving module 330a and a second pull-down driving module 330b. In the stage shift register unit 203a, the first pull-up driving module 300a comprises a first transistor (T1) having a drain and a gate both jointed to a pulse signal, such as a setting signal (STN−1) generated from the previous stage shift register unit 203a or an initial setting signal (i.e. STO or STE). In an exemplar of odd stage, the first pull-up driving module 300a of the third stage shift register unit 203a is based on a setting signal (ST1) generated from the first stage shift register unit 203a or an initial setting signal (STO) to provide a driving signal to turn on the pull-up module 310 of the third stage shift register unit 203a. Then the turned-on pull-up module 310 of the third stage shift register unit 203a generates a setting signal STN (e.g. ST3) via an output point to the first pull-up driving module 300a of the fifth stage shift register unit 203a next to the third stage shift register unit 203a. The second pull-up driving module 300b of the third stage shift register unit 203a connects a first source voltage (VSS1) to turn off the pull-up module 310 of the third stage shift register unit, based on a setting signal (i.e. ST5) generated from the fifth stage shift register unit 203a. In an exemplar of even stage, the first pull-up driving module 300a of the fourth stage shift register unit 203a is based on a setting signal (ST2) generated from the second stage shift register unit 203a or an initial setting signal (STE) to provide a driving signal to turn on the pull-up module 310 of the fourth stage shift register unit 203a. Then the turned-on pull-up module 310 of the fourth stage shift register unit 203a generates a setting signal STN (e.g. ST4) via an output point to the first pull-up driving module 300a of the sixth stage shift register unit 203a next to the fourth stage shift register unit 203a. The second pull-up driving module 300b of the fourth stage shift register unit connects the first source voltage (VSS1) to turn off the pull-up module 310 of the fourth stage shift register unit, based on a setting signal (i.e. ST6) generated from the sixth stage shift register unit 203a.

In each of the shift register units 203a as shown in FIG. 3A, the pull-up module 310 has a second transistor (T2), a third transistor (T3), an input node (Q) and an output node (OUT). The second transistor (T2) has a drain connected with one of a first signal (CK) and a second signal (XCK) (but only connected with the first signal (CK) in this embodiment), a gate connected with the input node (Q) of the pull-up module 310 for connecting to the driving signal, and a source connected with the output node (OUT) for generating an output signal as gate pulse signal (OUT₁~OUT$_{N+1}$). The third transistor (T3) has a drain connected with one of the first and second signals (CK and XCK), a gate connected with the input node (Q) of the pull-up module 310 for further connecting to the driving signal, and a source connected with the output point for generating the setting signal (STN) to the next stage shift register unit 203a. The input node (Q) is connected with a source of the first transistor (T1) of the first pull-up driving module 300a for further connecting the driving signal to the gates of both of the second and third transistors (T2 and T3). The output node (OUT) is used for outputting said gate pulse signal (OUT₁~OUT$_{N+1}$).

In operation, when the first transistor (T1) of the first pull-up driving module 300a is turned on via the drain and gate thereof by a specific level of the setting signal (i.e. STN−1), the source of the first transistor (T1) generates the driving signal via the input node (Q) to trigger the gates of both of the second and third transistors (T2 and T3) of the pull-up module 310 so that the second transistor (T2) is turned on and based on a specific level of the first signal (CK) to output its gate pulse signal (OUT₁~OUT$_{N+1}$), and the third transistor (T3) is turned on and generates the output signal serving as the setting signal (STN) via the output point to the next stage shift register unit 203a.

In each of the shift register units 203a as shown in FIG. 3A, the first pull-down driving module 330a further comprises a fourth transistor (T4) and a fifth transistor (T5). The fourth transistor (T4) has a drain and a gate both jointed to a third signal (P_CK). The fifth transistor (T5) has a drain connected with a source of the fourth transistor (T4), a gate connected with a fourth signal (P_-XCK), and a source connected with the first source voltage (VSS1).

In each of the shift register units 203a as shown in FIG. 3A, the first pull-down module 320a has a first input node (K), a sixth transistor (T6), a seventh transistor (T7) and an eighth transistor (T8). The first input node (K) is connected with both the source of the fourth transistor (T4) and the drain of the fifth transistor (T5). The sixth transistor (T6) has a drain connected with the input node (Q) of the pull-up module 310, a gate connected with the first input node (K), and a source connected with the first source voltage (VSS1). The seventh transistor (T7) has a drain connected with the setting signal (STN) via the output point to the next stage shift register unit 203a, a gate connected with the first input node (K) of the first pull-down module 320a, and a source connected with the first source voltage (VSS1). The eighth transistor (T8) has a drain connected with the output node (OUT) of the pull-up module 310, a gate connected with the first input node (K), and a source connected with the first source voltage (VSS1).

In operation, after the fourth transistor (T4) of the first pull-down driving module 330a is turned on by a specific high level (i.e. Vh) of the third signal (P_CK), all of the sixth transistor (T6), the seventh transistor (T7) and the eighth transistor (T8) of the first pull-down module 320a are therefore triggered via the first input node (K) to provide the first source voltage (VSS1) respectively for the output node (OUT), the input node (Q) and the output point of setting signal (STN) of the pull-up module 310. Due to a low level of the first source voltage (VSS1), the signal levels of the output node (OUT), the input node (Q) and the output point of the pull-up module 310 are pulled down. On the opposite, the fourth transistor (T4) can not be turned on by the third signal (P_CK) having an inverted phase relative to the fourth signal (P_XCK) after the fifth transistor (T5) of the first pull-down driving module 330a is turned on by a specific high level of the fourth signal (P_XCK). The turned-on fifth transistor (T5) provides the first source voltage (VSS1) via the first input node (K) to the gates of all of the sixth transistor (T6), the seventh transistor (T7) and the eighth transistor (T8) of the first pull-down module 320a so that the sixth transistor (T6), the seventh transistor (T7) and the eighth transistor (T8) all can not be turned on.

In each of the shift register units 203a as shown in FIG. 3A, the second pull-down driving module 330b further comprises a ninth transistor (T9), a tenth transistor (T10), an eleventh transistor (T11) and a twelfth transistor (T12). The ninth transistor (T9) has a drain connected with the first input node (K) of the first pull-down module 320a, a gate connected with the output node (Q) of the pull-up module 310, and a source connected with the first source voltage (VSS1). The tenth transistor (T10) has a gate connected with the input node (Q) of the pull-up module 310 and a source connected with the first source voltage (VSS1). The eleventh transistor (T11) has a drain and a gate both jointed to the fourth signal (P_XCK). The twelfth transistor (T12) has a drain connected with both of a source of the eleventh transistor (T11) and a drain of the tenth transistor (T10), a gate connected with the third signal (P_CK), and a source connected with the first source voltage (VSS1).

In each of the shift register units 203a as shown in FIG. 3A, the second pull-down module 320b further comprises a second input node (P), a thirteenth transistor (T13), a fourteenth transistor (T14) and a fifteenth transistor (T15). The second input node (P) is electrically connected with the drain of the tenth transistor (T10), the source of the eleventh transistor (T11) and the drain of the twelfth transistor (T12), respectively. The thirteenth transistor (T13) has a drain connected with the input node (Q) of the pull-up module 310, a gate connected with the second input node (P), the source of the eleventh transistor (T11) and the drain of the twelfth transistor (T12) of the second pull-down driving module 330b, and a source connected with the first source voltage (VSS1). The fourteenth transistor (T14) has a drain connected with the setting signal (STN) via the output point of the pull-up module 310 to the next stage shift register unit, a gate connected with the second input node (P), and a source connected with the first source voltage (VSS1). The fifteenth transistor (T15) has a drain connected with the output node (OUT) of the pull-up module 310, a gate connected with the second input node (P), and a source connected with the first source voltage (VSS1).

In operation, after the eleventh transistor (T11) of the second pull-down driving module 330b is turned on by a specific high level (i.e. Vh) of the fourth signal (P_XCK), all of the thirteenth transistor (T13), the fourteenth transistor (T14) and the fifteenth transistor (T15) of the second pull-down module 320b are therefore triggered via the second input node (P) to provide the first source voltage (VSS1) respectively for the output node (OUT), the input node (Q) and the output point of setting signal (STN) of the pull-up module 310. Due to the low level of the first source voltage (VSS1), the signal levels of the output node (OUT), the input node (Q) and the output point of the pull-up module 310 are pulled down. On the opposite, the eleventh transistor (T11) of the second pull-down driving module 330b can not be turned on by the fourth signal (P_XCK) having an inverted phase relative to the third signal (P_CK) after the twelfth transistor (T12) of the second pull-down driving module 330b is turned on by a specific high level of the third signal (P_CK). The turned-on twelfth transistor (T12) provides the first source voltage (VSS1) via the second input node (P) to the gates of all of the thirteenth transistor (T13), the fourteenth transistor (T14) and the fifteenth transistor (T15) of the second pull-down module 320b so that the thirteenth transistor (T13), the fourteenth transistor (T14) and the fifteenth transistor (T15) all can not be turned on. When the signal of the input node (Q) of the pull-up module 310 reaches a high level to trigger the gates of the ninth transistor (T9) of the second pull-down driving module 330b, the first source voltage (VSS1) is connected to the gates of several transistors disposed in both of the first and second pull-down module 320a, 320b as so to turn off the first and second pull-down module 320a, 320b and avoid pulling down the signal levels of the output node (OUT), the input node (Q) and the output point of the pull-up module 310.

In each of the shift register units 203a as shown in FIG. 3A, the second pull-up driving module 300b comprises a sixteenth transistor (T16) and a seventeenth transistor (T17). The sixteenth transistor (T16) has a drain connected with the input node (Q) of the pull-up module 310 and the gates of both of the second and third transistors (T2), (T3), a gate connected with the setting signal (STN+1) generated from the next stage shift register unit 203a via an input point, and a source connected with the first source voltage (VSS1). The seventeenth transistor (T17) has a drain connected with the output node (OUT) of the pull-up module 310, a gate connected with the setting signal (STN+1) generated from the next stage shift register unit 203a via the input point, and a source connected with the first source voltage (VSS1).

To sufficiently resist clock coupling effect, it has to be ensured that the signal level output from the pull-up module 310 is timely pulled down to acquire an optimal waveform output of the gate pulse signal. Differently from the prior art whose two clock signals (e.g. CK and XCK) use respective 50% of each duty cycle to drive its pull-down driving circuit, the third signal (P_CK) and the fourth signal (P_XCK) of the present invention respectively use different percentages of each duty cycle to drive the first and second pull-down driving modules 330a, 330b, wherein a waveform of the third signal (P_CK) is maintained ahead of a waveform of the first signal (CK) or the second signal (XCK) in a phase shift less than 180 degree, and a waveform of the fourth signal (P_XCK) is maintained to lag behind the waveform of the first signal (CK) or the second signal (XCK) in a phase shift less than 180 degree, or the waveform of the fourth signal (P_XCK) is maintained ahead of the waveform of the first signal (CK) or the second signal (XCK) in a phase shift less than 180 degree, and the waveform the third signal (P_CK) of is maintained to lag behind the waveform of the first signal (CK) or the second signal (XCK) in a phase shift less than 180 degree.

With utilization of the waveform of the third signal (P_CK) or the fourth signal (P_XCK) maintaining ahead of or lagging behind the waveform of the first signal (CK) or the second signal (XCK) in a phase shift less than 180 degree, the drawback of the prior art that a signal intensity of driving the pull-down driving circuit is insufficient can be overcome. For example, the fourth transistor (T4) of the first pull-down driving module 330a is based on a specific high level (i.e. Vh) of the third signal (P_CK) to trigger the gates of the sixth, seventh and eighth transistors (T6), (T7), (T8) of the first pull-down module 320a as turning on the first pull-down module 320a in advance for a specific period before the waveform of the first signal (CK) (or the second signal (XCK)) employed by the pull-up module 310 transits into a rising edge from a low level to a high level. This can ensure that the signal waveforms of the output node (OUT), the input node (Q) and the output point of setting signal (STN) of the pull-up module 310 all reach a pulled-down level for the specific period. For the same period, the twelfth transistor (T12) of the second pull-down driving module 330b is also based on the specific high level (i.e. Vh) of the third signal (P_CK) to connect the first source voltage (VSS1) to the gates of the thirteenth, fourteenth and fifteenth transistors (T13), (T14), (T15) of the second pull-down module 320b as turning off the second pull-down module 320b. Oppositely, the fifth transistor (T5) of the first pull-down driving module 330a is based on a specific high level (i.e. Vh) of the fourth signal (P_XCK) to connect the first source voltage (VSS1) to the gates of the sixth, seventh and eighth transistors (T6), (T7), (T8) of the first pull-down module 320a as turning off the first pull-down module 320a in advance for a specific period before the waveform of the first signal (CK) (or the second signal (XCK)) employed by the pull-up module 310 transits into a falling edge from a high level to a low level. For the same period, the eleventh transistor (T11) of the second pull-down driving module 330b is also based on the specific high level (i.e. Vh) of the fourth signal (P_XCK) to trigger the gates of the thirteenth, fourteenth and fifteenth transistors (T13), (T14), (T15) of the second pull-down module 320b as turning on the second pull-down module 320b. This can ensure that the signal waveforms of the output node (OUT), the input node (Q) and the output point of setting signal (STN) of the pull-up module 310 all reach a pulled-down level for the specific period.

Figure 5:
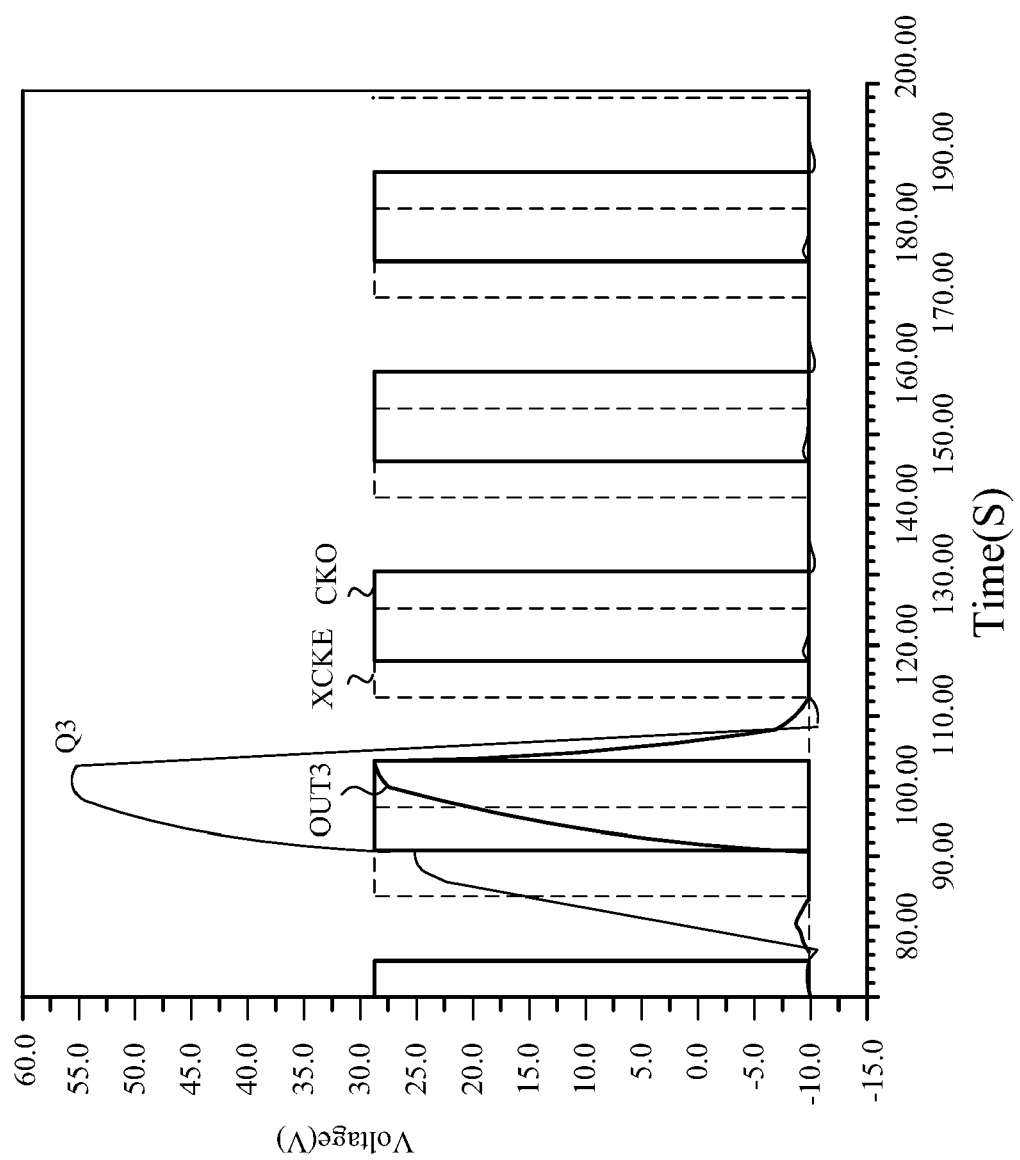
FIG. 5 illustrates a signal-simulated coordinate diagram of the third shift register unit according to the first preferred embodiment of the present invention, which respectively depict waveforms of a second periodic signal, a first clock signal, an output signal and an input signal.
Figure 6:
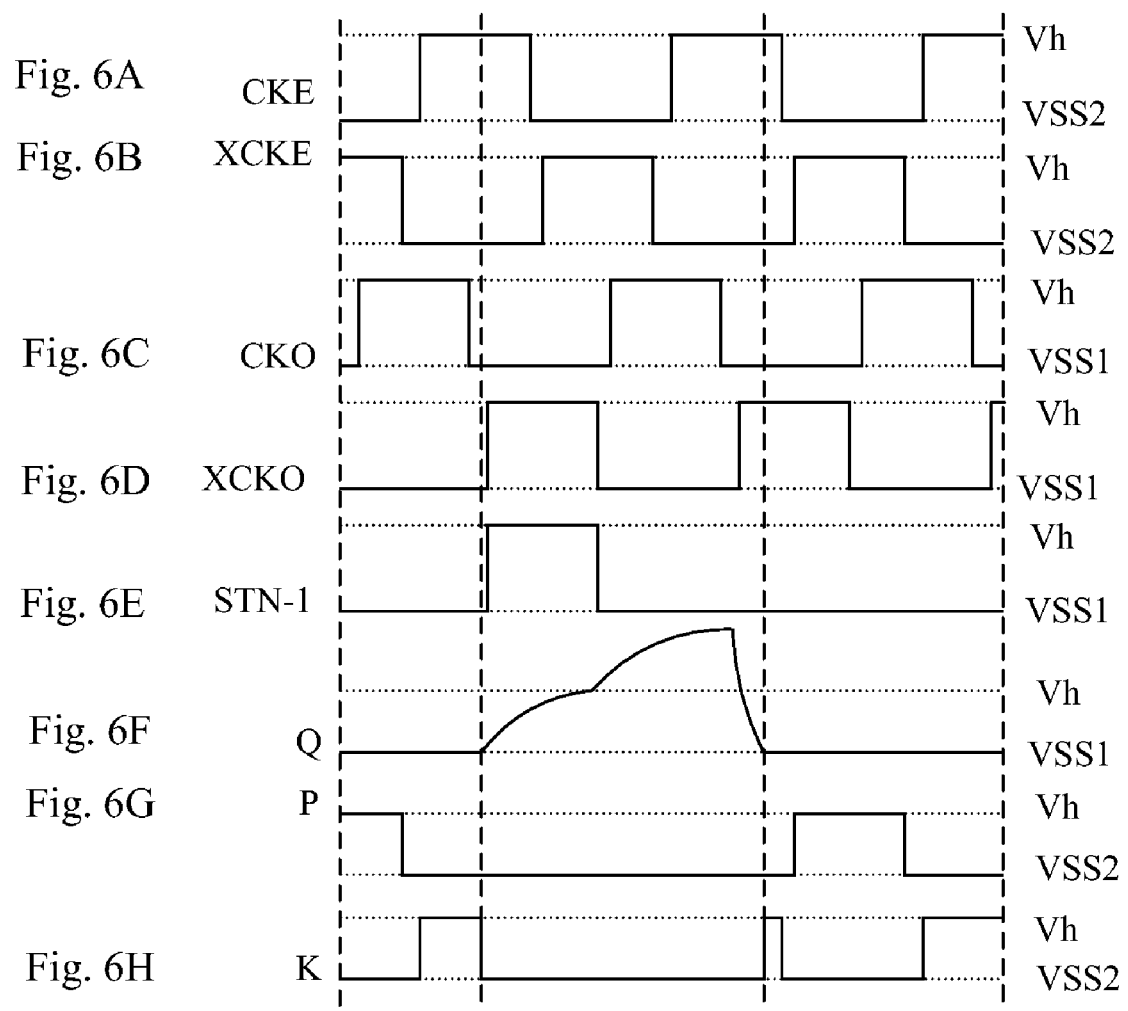
FIG. 6A to FIG. 6H illustrate various signal waveforms of the shift register unit according to the second preferred embodiment of the present invention, which respectively depict a first periodic signal, a second periodic signal, a first clock signal, a second clock signal, a setting signal generated from the previous stage shift register unit, an input signal and several signals of various nodes.

Turning to FIG. 2, the plurality of odd-sage shift register units (e.g. $GOA_1$, $GOA_3$, $GOA_5$ ... $GOA_N$) and the plurality of even-sage shift register units (e.g. $GOA_2$, $GOA_4$, $GOA_6$ ... $GOA_{N+1}$) of the shift register 200 according to the present invention are respectively connected with a first clock signal (CKO), a second clock signal (XCKO) inverted relative to the first clock signal (CKO), a first periodic signal (CKE) and a second periodic signal (XCKE) inverted relative to the first periodic signal (CKE) for driving. As shown in FIG. 3A, in each of the odd-stage shift register units of this embodiment, the first signal (CK) is designated into the first clock signal (CKO), the second signal (XCK) is designated into the second clock signal (XCKO), the third signal (P_CK) is designated into the first periodic signal (CKE) and the fourth signal (P_XCK) is designated into the second periodic signal (XCKE); oppositely, in each of the even-stage shift register units of this embodiment, the first signal (CK) is designated into the first periodic signal (CKE), the second signal (XCK) is designated into the second periodic signal (XCKE), the third signal (P_CK) is designated into the first clock signal (CKO) and the fourth signal (P_XCK) is designated into the second clock signal (XCKO), wherein there are fixed phase shifts predetermined among the first periodic signal (CKE), the second periodic signal (XCKE), the first clock signal (CKO) and the second clock signal (XCKO). For example, as shown in FIG. 4A to FIG. 4E, waveforms of various signals employed by the shift register unit 203a according to the first preferred embodiment of the present invention are respectively depicted, which includes the first periodic signal (CKE), the second periodic signal (XCKE), the first clock signal (CKO), the second clock signal (XCKO) and a setting signal (STN−1) generated from the previous stage shift register unit 203a. Under presetting, the waveform of the second periodic signal (XCKE) is always maintained ahead of a rising edge (E1) of the waveform of the first clock signal (CKO) in a phase shift (P1) less than 180 degree, and the waveform of the first periodic signal (CKE) is always maintained to lag behind a falling edge (E2) of the waveform of the first clock signal (CKO) in a phase shift (P2) less than 180 degree. To acquire an optimal pulled-down waveform of the gate pulse signal outputted from the output node (OUT), a crest width of the waveform of the first periodic signal (CKE) can be preset smaller than a trough width of the waveform of the second periodic signal (XCKE), and a crest width of the waveform of the first clock signal (CKO) can be preset smaller than a trough width of the waveform of the second clock signal (XCKO), or each of the waveforms of the first periodic signal (CKE), the second periodic signal (XCKE), the first clock signal (CKO) and the second clock signal (XCKO) has a crest width (W1) and a trough width (W2) wherein the crest width (W1) can be preset smaller than the trough width (W2). In another exemplar, the crest and trough (or High/Low) of the waveform of each of the first periodic signal (CKE), the second periodic signal (XCKE), the first clock signal (CKO) and the second clock signal (XCKO) can be preset to respectively use 45% and 55% of each duty cycle. By the crest and trough of the signal waveform using 45% and 55% of each duty cycle, FIG. 5 illustrates a signal-simulated coordinate diagram with a horizontal axis representative of time (S) and a vertical axis representative of voltage (V), which respectively simulates waveforms of the second periodic signal (XCKE), the first clock signal (CKO), the output signal of the output node (OUT3) and the input signal of the input node (Q3) of the pull-up module 310 in the third stage shift register unit 203a according to the first preferred embodiment of the present invention. As shown in FIG. 5, when the second periodic signal (XCKE) is maintained ahead of the first clock signal (CKO) in a phase shift less than 180 degree, it is acquired that the third stage shift register unit 203a can generate an optimal output signal waveform of the output node (OUT3) and an optimal rising and falling edges of the input signal waveform of the input node (Q3) and therefore its clock coupling effect can be completely diminished.

It notes that the first and second periodic signals (CKE), (XCKE) do not need to be limited in a clock type but can be implemented with any signal source which can be controlled to have a specific phase shift relative to the first and second clock signals (CKO), (XCKO).

Figure 3B:
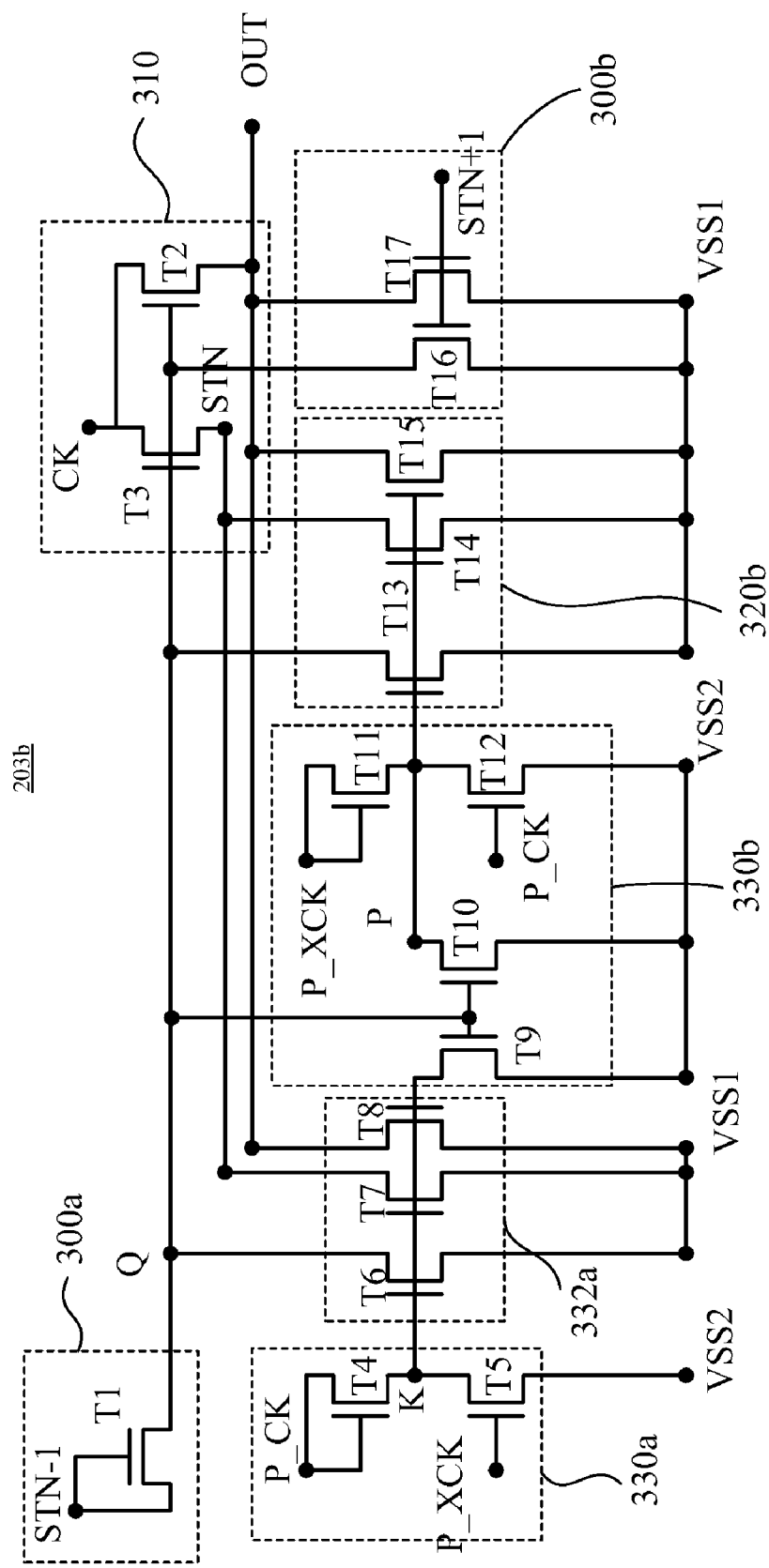
FIG. 3B illustrates a schematic circuitry diagram of each of shift register units in the shift register according to a second preferred embodiment of the present invention.

Further referring to illustration of FIG. 3B, a shift register unit 203b according to a second prefer embodiment of the present invention is introduced herein. The shift register unit 203b can be one of the odd-stage cascaded shift register unit (e.g. $GOA_1$, $GOA_3$, $GOA_5$ ... $GOA_N$) and the even-stage cascaded shift register units (e.g. $GOA_2$, $GOA_4$, $GOA_6$ ... $GOA_{N+1}$), as the same as shown in FIG. 2. Differences from the shift register unit 203a of the first embodiment is that in the shift register unit 203b of the second prefer embodiment, the source of the fifth transistor (T5) of the first pull-down driving module 330a is connected to a second source voltage (VSS2), and the sources of all the ninth transistor (T9), the tenth transistor (T10) and the twelfth transistor (T12) of the second pull-down driving module 330b are also connected to the second source voltage (VSS2). By the level of the second source voltage (VSS2) (i.e. −10V to −15V) lower than that of the first source voltage (VSS1) (i.e. −6V to 0V), the various transistors (T6), (T7), (T8) of the first pull-down module 330a and various transistors (T13), (T14), (T15) of the second pull-down module 330b can be turned off, timely. Hereinafter does not repeat where the rest of the shift register unit 203b of the second prefer embodiment is the same as the shift register unit 203a of the first embodiment.

Further referring to FIG. 6A to FIG. 6H, which illustrate various signal waveforms of the shift register unit 203b according to the second embodiment of the present invention, which depict the lowest level of each of the first clock signal (CKO), the second clock signal (XCKO) and a setting signal (STN−1) generated from the previous stage shift register unit 203b and an input signal of the input node (Q) of the shift register unit 203b is the same as the level of the first source voltage (VSS1), but the lowest level of each of the first periodic signal (CKE), the second periodic signal (XCKE), the signal of the first input node (K) of the first pull-down module 320a and the signal of the second input node (P) of the second pull-down module 320b is the same as the level of the second source voltage (VSS2).

Figure 3C:
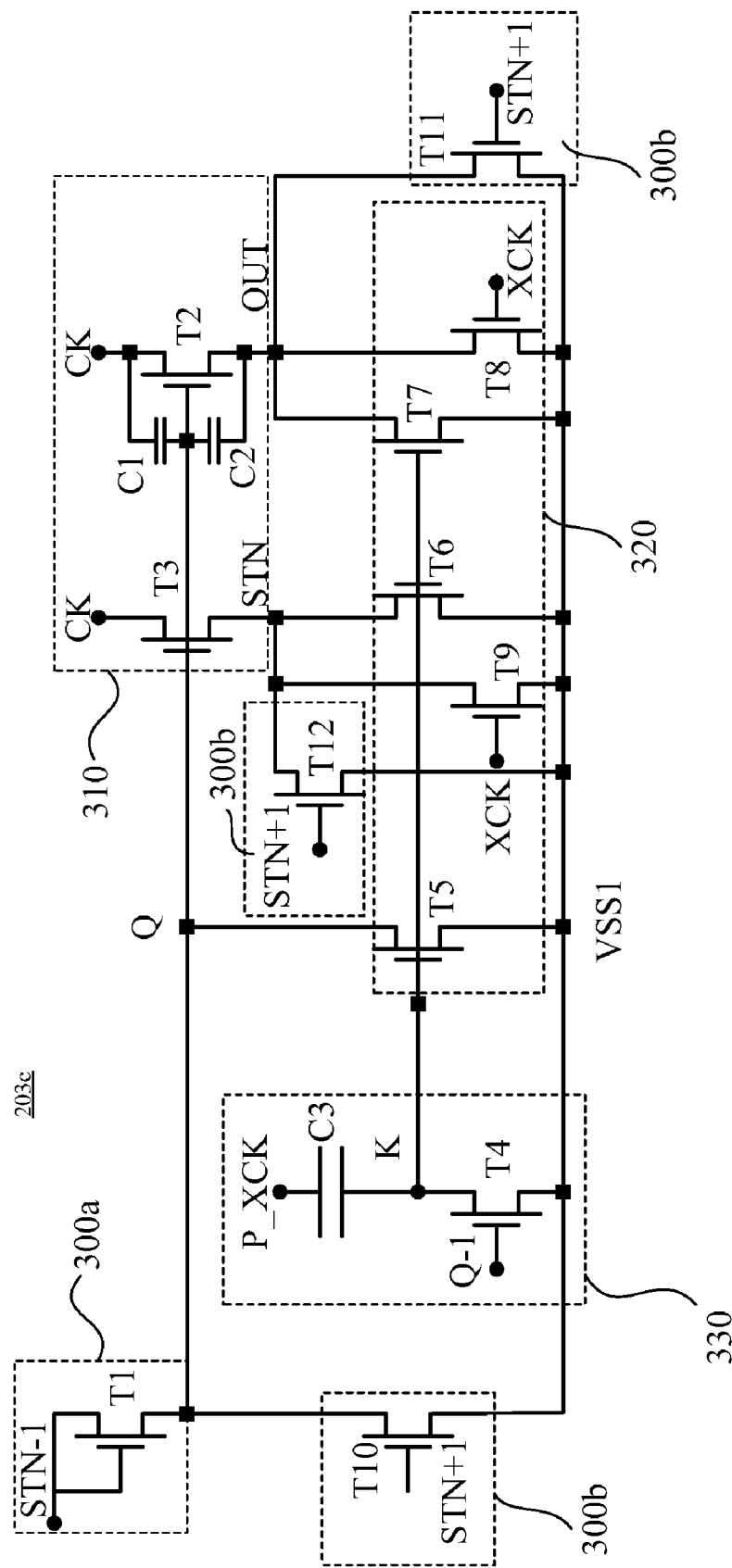
FIG. 3C illustrates a schematic circuitry diagram of each of shift register units in the shift register according to a third preferred embodiment of the present invention.

Further referring to illustration of FIG. 3C, a shift register unit 203c according to a third prefer embodiment of the present invention is introduced herein. As the same as shown in FIG. 2, the shift register unit 203c can be one of the odd-stage cascaded shift register unit (e.g. $GOA_1$, $GOA_3$, $GOA_5$ ... $GOA_N$) and the even-stage cascaded shift register units (e.g. $GOA_2$, $GOA_4$, $GOA_6$ ... $GOA_{N+1}$). The shift register unit 203c of the third embodiment is designed only for connecting the first signal (CK), the second signal (XCK) and the fourth signal (P_XCK), and primarily comprises a first pull-up driving module 300a, a second pull-up driving module 300b, a pull-up module 310, a pull-down module 320, and a pull-down driving module 330.

The first pull-up driving module 300a of the shift register unit 203c comprises a first transistor (T1) having a drain and a gate both jointed to a pulse signal, such as a setting signal (STN−1) generated from the previous stage shift register unit 203c or an initial setting signal (i.e. STO or STE), and a source for generating a driving signal in response to trigger of the pulse signal on the first transistor (T1).

The pull-up module 310 of the shift register unit 203c has an input node (Q), a second transistor (T2), a first capacitor (C1), a second capacitor (C2), a third transistor (T3) and an output node (OUT). The second transistor (T2) has a drain connected with one of a first signal (CK) and a second signal (XCK) (but only connected with the first signal (CK) in this third embodiment), a gate connected with the input node (Q) for connecting to the driving signal of the first pull-up driving module 300a, and a source connected with the output node (OUT) for generating an output signal as gate pulse signal (e.g. $OUT_1 \cdot OUT_{N+1}$). The first capacitor (C1) has a polar terminal connected with the first signal (CK) (or the second signal (XCK)) and another polar terminal connected with both of the input node (Q) and the driving signal. The second capacitor (C2) has a polar terminal connected with the first signal (CK) (or the second signal (XCK)) and another polar terminal connected with the source of the second transistor (T2). The third transistor (T3) has a drain connected with the first signal (CK) (or the second signal (XCK)), a gate connected with the input node (Q) for further connecting to the driving signal, and a source connected with the output point for generating the setting signal (STN) to the next stage shift register unit 203c.

The pull-down driving module 330 of the shift register unit 203c comprises a third capacitor (C3) and a fourth transistor (T4), wherein the third capacitor (C3) has a polar terminal connected with the fourth signal (P_XCK) and another polar terminal connected with a first input node (K) of the pull-down module 320, and the fourth transistor (T4) has a drain connected with the first input node (K), a gate connected with an input signal on an input node (Q−1) of the previous stage shift register unit 203c, and a source connected with the first source voltage (VSS1). Accordingly, the whole system reliability can be raised by the pull-down driving module 330 which is constituted with connections of the third capacitor (C3) to the fourth signal (P_XCK) and the fourth transistor (T4).

The pull-down module 320 of the shift register unit 203c comprises a fifth transistor (T5), a sixth transistor (T6), a seventh transistor (T7), an eighth transistor (T8) and a ninth transistor (T9). The fifth transistor (T5) has a drain connected with the input node (Q) of the pull-up module 310, a gate connected with the first input node (K) of the pull-down module 330, and a source connected with the first source voltage (VSS1). The sixth transistor (T6) has a drain connected with the setting signal (STN) to the next stage shift register unit 203c via an output point of the pull-up module 310, a gate connected with the first input node (K), and a source connected with the first source voltage (VSS1). The seventh transistor (T7) has a drain connected with the output node (OUT) of the pull-up module 310, a gate connected with the first input node (K), and a source connected with the first source voltage (VSS1). The eighth transistor (T8) has a drain connected with the output node (OUT) of the pull-up module 310, a gate connected with the second signal (XCK), and a source connected with the first source voltage (VSS1). The ninth transistor (T9) has a drain connected with the setting signal (STN) to the next stage shift register unit 203c via the output point of the pull-up module 310, a gate connected with the second signal (XCK), and a source connected with the first source voltage (VSS1).

The pull-up driving module 300b of the shift register unit 203c comprises a tenth transistor (T10), an eleventh transistor (T11) and a twelfth transistor (T12). The tenth transistor (T10) has a drain connected with the source of the first transistor (T1) of the first pull-up driving module 300a, a gate connected with a setting signal (STN+1) generated from the next stage shift register unit 203c, and a source connected with the first source voltage (VSS1). The eleventh transistor (T11) has a drain connected with the output node (OUT) of the pull-up module 310, and a gate connected with the setting signal (STN+1) generated from the next stage shift register unit 203c, and a source connected with the first source voltage (VSS1). The twelfth transistor (T12) has a drain connected with the setting signal (STN) to the next stage shift register unit 203c via the output point of the pull-up module 310, a gate connected with the setting signal (STN+1) generated from the next stage shift register unit 203c, and a source connected with the first source voltage (VSS1). As the same as the shift register units 203a disposed in the first embodiment, in each of the odd-stage shift register units 203c of the third embodiment, the first signal (CK) is designated into the first clock signal (CKO), the second signal (XCK) is designated into the second clock signal (XCKO), the third signal (P_CK) is designated into the first periodic signal (CKE) and the fourth signal (P_XCK) is designated into the second periodic signal (XCKE); oppositely, in each of the even-stage shift register units of this embodiment, the first signal (CK) is designated into the first periodic signal (CKE), the second signal (XCK) is designated into the second periodic signal (XCKE), the third signal (P_CK) is designated into the first clock signal (CKO) and the fourth signal (P_XCK) is designated into the second clock signal (XCKO).

Figure 7:
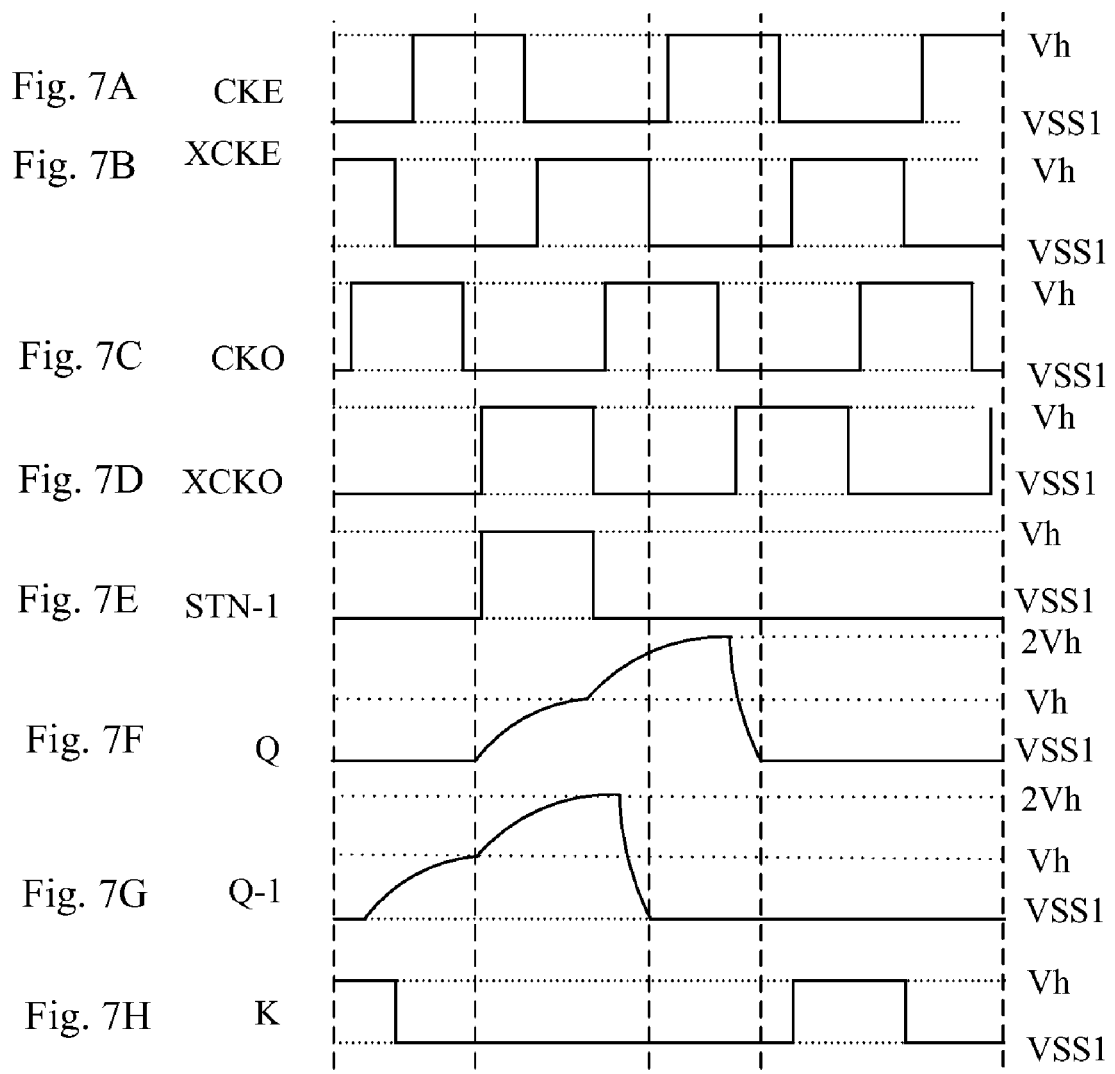
FIG. 7A to FIG. 7H illustrate various signal waveforms of the shift register unit according to the third preferred embodiment of the present invention, which respectively depict a first periodic signal, a second periodic signal, a first clock signal, a second clock signal, a setting signal generated from the previous stage shift register unit, several signals of various nodes and an input signal generated from the previous stage shift register unit.

Further referring to FIG. 7A to FIG. 7H, which illustrate various signal waveforms of the shift register unit 203c according to the third preferred embodiment of the present invention, which depict the first periodic signal (CKE), the second periodic signal (XCKE), the first clock signal (CKO), the second clock signal (XCKO), a setting signal (STN−1) generated from the previous stage shift register unit 203c, an input signal of the input node (Q) of the shift register unit 203c, an input signal inputted from an input node (Q−1) of the previous stage shift register unit 203c and a signal inputted from the first input node (K) of the pull-down module 320. In operation, after the fourth transistor (T4) of the pull-down driving module 330 is triggered to be electrically conductive by a specific high signal level (i.e. Vh) of the input node (Q−1) of the previous stage shift register unit 203c as shown in FIG. 7G, the first source voltage (VSS1) is connected to the first input node (K) of the pull-down module 320 and thereby pulls down the signal level of the first input node (K) to reach a voltage level 'VSS1' as shown in FIG. 7H so that the pull-down module 320 is not turned on to facilitate rise of signal waveform of the input node (Q) of the shift register unit 203c to reach a level 'Vh' as shown in FIG. 7F. Oppositely, for a specific time period before the first clock signal (CKO) in FIG. 7C transits from a low level 'VSS1' to a high level 'Vh', the second periodic signal (XCKE) in FIG. 7B is pre-maintained in a high level 'Vh' by the third capacitor (C3) to turn on the pull-down module 320 for pulling down the signal level of the input node (Q) to reach a level 'VSS1' as shown in FIG. 7F. For the same specific time period, the first and second capacitors (C1), (C2) and coupling effect invoked from the first clock signal (CKO) are also able to pull down the signal level of the input node (Q) to reach the level 'VSS1' in FIG. 7F and further prevent the signal level of the input node (Q) from being pulled up. Thus, this can ensure stability of the output waveform of the output node (OUT) of the pull-up module 310.

Figure 8:
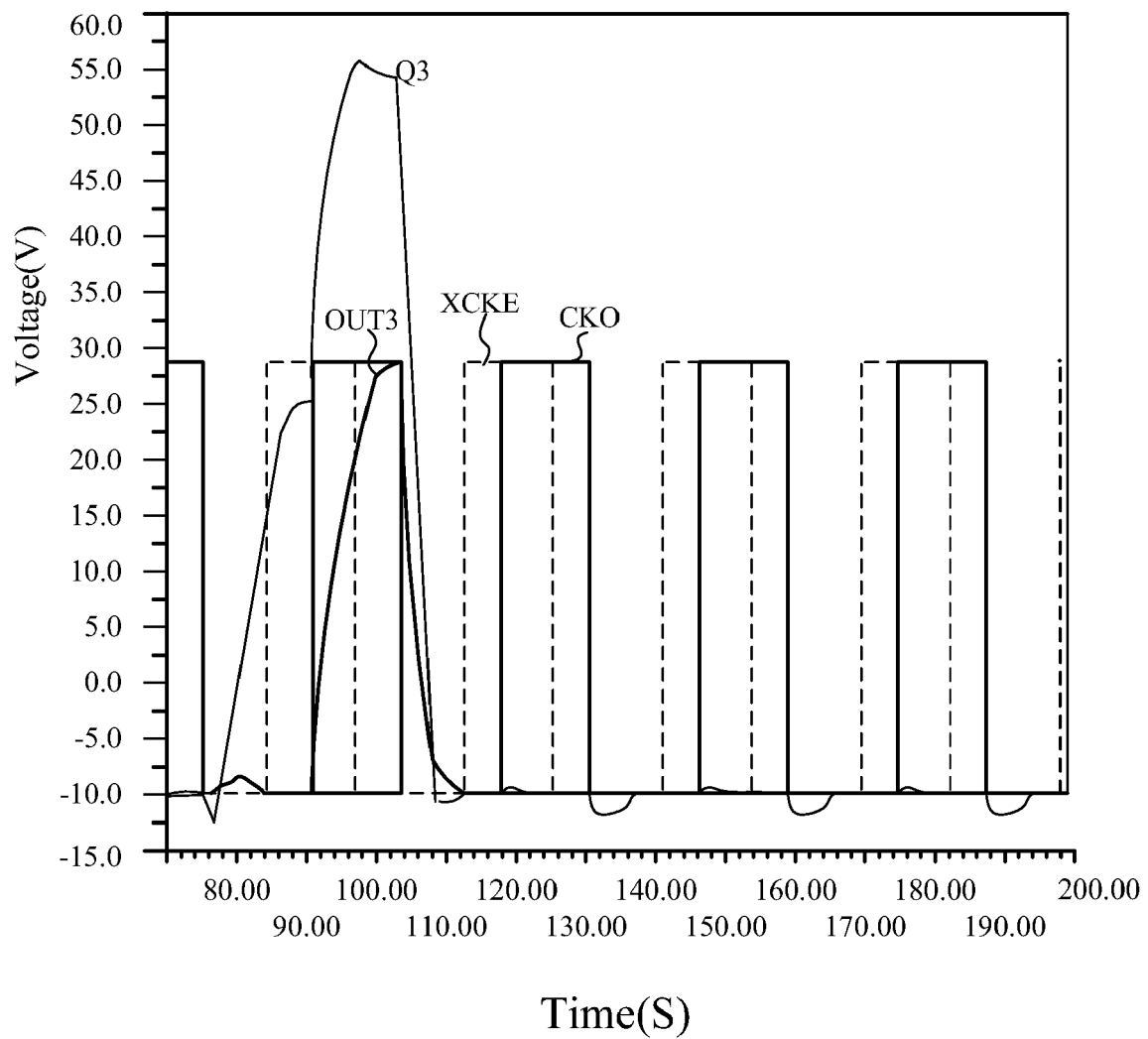
FIG. 8 illustrates a signal-simulated coordinate diagram of the third shift register unit according to the third preferred embodiment of the present invention, which respectively depict waveforms of a second periodic signal, a first clock signal, an output signal and an input signal.

FIG. 8 illustrates a signal-simulated coordinate diagram with a horizontal axis representative of time (S) and a vertical axis representative of voltage (V), which respectively simulates waveforms of the second periodic signal (XCKE), the first clock signal (CKO), the output signal of the output node (OUT3) and the input signal of the input node (Q3) of the pull-up module 310 in the third stage shift register unit 203c according to the third embodiment of the present invention. As shown in FIG. 8, when the second periodic signal (XCKE) is maintained ahead of the first clock signal (CKO) in a phase shift less than 180 degree, it is acquired that the third stage shift register unit 203c can generate an optimal output signal waveform of the output node (OUT3) and an optimal rising and falling edges of the input signal waveform of the input node (Q3) and therefore its clock coupling effect can be completely diminished.

It is to be understood, however, that even though numerous characteristics and advantages of the present invention have been set fourth in the foregoing description, together with details of the structure and function of the invention, the disclosure is illustrative only, and changes may be made in detail within the principles of the invention to the full extent indicated by the broad general meaning of the terms in which the appended claims are expressed.

What is claimed is:

1. A shift register comprising multi-stage shift register units each of which comprises:
    at least one pull-up driving module for providing a driving signal according to a pulse signal;
    a pull-up module outputting an output signal according to one of a first signal and a second signal when the pull-up module is triggered by the driving signal to be electrically conductive;
    at least one pull-down module for providing the pull-up module with a first source voltage; and
    at least one pull-down driving module based on one of a third signal and a fourth signal, triggering the at least one pull-down module for a specific period before a waveform of either the first signal or the second signal transits into either a rising edge or a falling edge.

2. The shift register as claimed in claim 1, wherein the pull-down driving module is based on the third signal to turn on the pull-down module in advance for the specific period before the waveform of either the first signal or the second signal transits into the rising edge, and/or the pull-down driving module is based on the fourth signal to turn off the pull-down module in advance for the specific period before the waveform of either the first signal or second signal transits into the falling edge.

3. The shift register as claimed in claim 1, wherein the multi-stage shift register units comprises:

a plurality of odd-stage shift register units, at least one of which utilizes the pull-up driving module to turn on the pull-up module based on a setting signal generated from a previous odd-stage shift register unit or an initial setting signal so that the turned-on pull-up module of the odd-stage shift register unit generates a setting signal to the pull-up driving module of a next odd-stage shift register unit, and provides the first source voltage to turn off the pull-up module of the odd-stage shift register unit, based on a setting signal generated from the next odd-stage shift register unit; and a plurality of even-stage shift register units, at least one of which utilizes the pull-up driving module to provide the driving signal to turn on the pull-up module based on a setting signal generated from a previous even-stage shift register unit or an initial setting signal so that the turned-on pull-up module of the even-stage shift register unit generates a setting signal to the pull-up driving module of a next even-stage shift register unit, and utilizes the pull-up driving module of the even-stage shift register unit to provide the first source voltage to turn off the pull-up module of the even-stage shift register unit, based on a setting signal generated from the next even-stage shift register unit.

4. The shift register as claimed in claim 3, wherein the multi-stage shift register units comprises:
    the odd-stage shift register units each whose the first signal is designated into a first clock signal, the second signal is designated into a second clock signal inverted with relative to the first clock signal, the third signal is designated into a first periodic signal and the fourth signal is designated into a second periodic signal with an inverted phase relative to the first periodic signal; and
    the even-stage shift register units each whose the first signal is designated into the first periodic signal, the second signal is designated into the second periodic signal, the third signal is designated into the first clock signal and the fourth signal is designated into the second clock signal.

5. The shift register as claimed in claim 4, wherein a waveform of the first periodic signal is maintained ahead of a waveform of the first clock signal in a phase shift less than 180 degree, and a waveform of the second periodic signal is maintained to lag behind a waveform of the first clock signal in a phase shift less than 180 degree.

6. The shift register as claimed in claim 4, wherein a crest width of the waveform of the first periodic signal is smaller than a trough width of the waveform of the second periodic signal, and a crest width of the waveform of the first clock signal is smaller than a trough width of the waveform of the second clock signal.

7. The shift register as claimed in claim 4, wherein each of the waveforms of the first periodic signal, second periodic signal, the first clock signal and the second clock signal has a trough width and a crest width smaller than the trough width.

8. The shift register as claimed in claim 4, wherein the pull-up module has an input node for connecting with the driving signal and an output node for outputting said output signal, and the pull-down module has a first input node and is used for providing the output node of the pull-up module with the first source voltage, and the pull-down driving module is connected with the first input node of the pull-down module for turning on the pull-down module.

9. The shift register as claimed in claim 8, wherein the pull-up driving module comprises a first transistor having a drain and a gate both jointed to the pulse signal, and a source connected with the input node of the pull-up module and used for providing the driving signal.

10. The shift register as claimed in claim 9, wherein the pull-up module further comprises:
   a second transistor having a drain connected with one of the first and second signals, a gate connected with both of the input node of the pull-up module and the driving signal, and a source connected with the output node for generating the output signal; and
   a third transistor having a drain connected with one of the first and second signals, a gate connected with both of the input node of the pull-up module and the driving signal, and a source for generating a setting signal to the next stage shift register unit.

11. The shift register as claimed in claim 10, wherein the pull-down driving module further comprises:
   a fourth transistor having a drain and a gate both jointed to the third signal, and a source connected with the first input node of the pull-down module; and
   a fifth transistor having a drain connected with the first input node of the pull-down module, a gate connected with the fourth signal, and a source connected with either the first source voltage or a second source voltage having a level higher than that of the first source voltage.

12. The shift register as claimed in claim 11, wherein the pull-down module further comprises:
   a sixth transistor having a drain connected with the input node of the pull-up module, a gate connected with the first input node of the pull-down module, and a source connected with the first source voltage;
   a seventh transistor having a drain connected with the setting signal to the next stage shift register unit via the pull-up module, a gate connected with the first input node of the pull-down module, and a source connected with the first source voltage; and
   an eighth transistor having a drain connected with the output node, a gate connected with the first input node of the pull-down module, and a source connected with the first source voltage.

13. The shift register as claimed in claim 12, wherein the pull-down driving module further comprises:
   a ninth transistor having a drain connected with the first input node of the pull-down module, a gate connected with the output node of the pull-up module, and a source connected with either the first source voltage or the second source voltage;
   a tenth transistor having a drain connected with a second input node of the pull-down module, a gate connected with the input node of the pull-up module, and a source connected with either the first source voltage or the second source voltage;
   an eleventh transistor having a drain and a gate both jointed to the fourth signal, and a source connected with the second input node of the pull-down module; and
   a twelfth transistor having a drain connected with the second input node of the pull-down module, a gate connected with the third signal, and a source connected with either the first source voltage or the second source voltage.

14. The shift register as claimed in claim 13, wherein the pull-down module further comprises:
   a thirteenth transistor having a drain connected with the input node of the pull-up module, a gate connected with the second input node of the pull-down module, and a source connected with the first source voltage;
   a fourteenth transistor having a drain connected with the setting signal to the next stage shift register unit via the pull-up module, a gate connected with the second input node of the pull-down module, and a source connected with the first source voltage; and
   a fifteenth transistor having a drain connected with the output node of the pull-up module, a gate connected with the second input node of the pull-down module, and a source connected with the first source voltage.

15. The shift register as claimed in claim 14, wherein the pull-up driving module further comprises:
   a sixteenth transistor having a drain connected with the input node of the pull-up module, a gate connected with the setting signal of the next stage shift register unit, and a source connected with the first source voltage;
   a seventeenth transistor having a drain connected with the output node of the pull-up module, a gate connected with the setting signal of the next stage shift register unit, and a source connected with the first source voltage.

16. The shift register as claimed in claim 9, wherein the pull-up module further comprises:
   a second transistor having a drain connected with one of the first and second signals, a gate connected with both of the input node of the pull-up module and the driving signal, and a source connected with the output node for generating the output signal;
   a first capacitor having a polar terminal connected with one of the first and second signals, and another polar terminal connected with both of the input node of the pull-up module and the driving signal;
   a second capacitor having a polar terminal connected with one of the first and second signals, and another polar terminal connected with the source of the second transistor; and
   a third transistor having a drain connected with one of the first and second signals, a gate connected with both of the input node of the pull-up module and the driving signal, and a source for generating a setting signal to the next stage shift register unit.

17. The shift register as claimed in claim 16, wherein the pull-down driving module further comprises:
   a third capacitor having a polar terminal connected with the fourth signal, and another polar terminal connected with the first input node of the pull-down module; and
   a fourth transistor having a drain connected with the first input node of the pull-down module, a gate connected with an input signal on an input node of the previous stage shift register unit, and a source connected with the first source voltage.

18. The shift register as claimed in claim 17, wherein the pull-down module further comprises:
   a fifth transistor having a drain connected with the input node of the pull-up module, a gate connected with the first input node of the pull-down module, and a source connected with the first source voltage;
   a sixth transistor having a drain connected with the setting signal to the next stage shift register unit via the pull-up module, a gate connected with the first input node of the pull-down module, and a source connected with the first source voltage;
   a seventh transistor having a drain connected with the output node, a gate connected with the first input node of the pull-down module, and a source connected with the first source voltage;
   an eighth transistor having a drain connected with the output node, a gate connected with one of the first and second signals, and a source connected with the first source voltage; and a ninth transistor having a drain connected with the setting signal to the next stage shift register unit via the pull-up module, a gate connected with connected with one of the first and second signals, and a source connected with either the first source voltage or the second source voltage.

19. The shift register as claimed in claim 18, wherein the pull-up driving module further comprises:
a tenth transistor having a drain connected with the source of the first transistor, a gate connected with the setting signal of the next stage shift register unit, and a source connected with the first source voltage;
an eleventh transistor having a drain connected with the output node of the pull-up module, and a gate connected with the setting signal generated from the next stage shift register unit, and a source connected with the first source voltage; and
a twelfth transistor having a drain connected with the setting signal to the next stage shift register unit via the pull-up module, a gate connected with the setting signal generated from the next stage shift register unit, and a source connected with the first source voltage.

20. A shift register comprising multi-stage shift register units each of which comprises:
a pull-up module outputting an output signal according to one of a first signal and a second signal;
at least one pull-up driving module turning on the pull-up module in response to either an output signal generated from a previous stage shift register unit or an initial signal, and turning off the pull-up module in response to an output signal generated from a next stage shift register unit;
at least one pull-down module for providing the pull-up module with a first source voltage to pull down a level of the output signal of said pull-up module; and
at least one pull-down driving module based on a third signal to turn on the at least one pull-down module for a specific period before a waveform of either the first signal or the second signal transits into a rising edge, and based on a fourth signal to turn off the at least one pull-down module for a specific period before the waveform of either the first signal or the second signal transits into a falling edge.

21. The shift register as claimed in claim 20, wherein the multi-stage shift register units comprises:
a plurality of odd-stage shift register units, at least one of which utilizes the pull-up driving module to turn on the pull-up module based on an output signal generated from a previous odd-stage shift register unit or the initial signal so that the turned-on pull-up module of the odd-stage shift register unit generates the output signal to the pull-up driving module of a next odd-stage shift register unit, and utilizes the pull-up driving module of the odd-stage shift register unit to connect the first source voltage to turn off the pull-up module of the odd-stage shift register unit, based on an output signal generated from the next odd-stage shift register unit; and
a plurality of even-stage shift register units, at least one of which utilizes the pull-up driving module to turn on the pull-up module based on an output signal generated from a previous even-stage shift register unit or the initial signal so that the turned-on pull-up module of the even-stage shift register unit generates the output signal to the pull-up driving module of a next even-stage shift register unit, and utilizes the pull-up driving module of the even-stage shift register unit to connect the first source voltage to turn off the pull-up module of the even-stage shift register unit, based on an output signal generated from the next even-stage shift register unit.

22. The shift register as claimed in claim 21, wherein the multi-stage shift register units comprises:
the odd-stage shift register units each whose the first signal is designated into a first clock signal, the second signal is designated into a second clock signal inverted with relative to the first clock signal, the third signal is designated into a first periodic signal, and the fourth signal is designated into a second periodic signal with an inverted phase relative to the first periodic signal; and
the even-stage shift register units each whose the first signal is designated into the first periodic signal, the second signal is designated into the second periodic signal, the third signal is designated into the first clock signal and the fourth signal is designated into the second clock signal.

23. The shift register as claimed in claim 22, wherein a waveform of the first periodic signal is maintained ahead of a waveform of the first clock signal in a phase shift less than 180 degree, and a waveform of the second periodic signal is maintained to lag behind a waveform of the first clock signal in a phase shift less than 180 degree.

24. The shift register as claimed in claim 22, wherein a crest width of the waveform of the first periodic signal is smaller than a trough width of the waveform of the second periodic signal, and a crest width of the waveform of the first clock signal is smaller than a trough width of the waveform of the second clock signal.

25. The shift register as claimed in claim 22, wherein each of the waveforms of the first periodic signal, second periodic signal, the first clock signal and the second clock signal has a trough width and a crest width smaller than the trough width.

26. A shift register unit for diminishing clock coupling effect, comprising:
a pull-up module outputting an output signal via an output node according to one of a first signal and a second signal;
at least one pull-up driving module turning on the pull-up module based on a pulse signal;
at least one pull-down module for providing the pull-up module with a first source voltage to pull down a level of the output signal of said pull-up module; and
at least one pull-down driving module based on one of a third signal and a fourth signal, triggering the at least one pull-down module for a specific period before a waveform of either the first signal or the second signal transits into one of a rising edge and a falling edge.

27. The shift register unit as claimed in claim 26, wherein the pull-down driving module is based on the third signal to turn on the pull-down module for the specific period before the waveform of either the first signal or the second signal transits into the rising edge, and the pull-down driving module is based on the fourth signal to turn off the pull-down module for the specific period before the waveform of either the first signal or the second signal transits into the falling edge.

28. The shift register unit as claimed in claim 27, wherein a waveform of the third signal is maintained ahead of a waveform of either the first signal or the second signal in a phase shift less than 180 degree, and a waveform of the fourth signal is maintained to lag behind a waveform of either the first signal or the second signal in a phase shift less than 180 degree.

29. The shift register unit as claimed in claim 27, wherein a crest width of the waveform of the first signal is smaller than a trough width of the waveform of the second signal, and a crest width of the waveform of the third signal is smaller than a trough width of the waveform of the fourth signal.

30. The shift register unit as claimed in claim 27, wherein each of the waveforms of the first signal, the second signal, the third signal and the fourth signal has a trough width and a crest width smaller than the trough width.

* * * * *